(12) United States Patent
Mai

(10) Patent No.: US 6,956,389 B1
(45) Date of Patent: Oct. 18, 2005

(54) HIGHLY RESILIENT CANTILEVER SPRING PROBE FOR TESTING ICS

(75) Inventor: Phillip Mai, San Francisco, CA (US)

(73) Assignee: JEM America Corporation, Fremont, CA (US)

( * ) Notice: Subject to any disclaimer, the term of this patent is extended or adjusted under 35 U.S.C. 154(b) by 0 days.

(21) Appl. No.: 10/919,836

(22) Filed: Aug. 16, 2004

(51) Int. Cl.[7] ............................................. G01R 31/02
(52) U.S. Cl. ...................... 324/758; 324/762
(58) Field of Search .................. 324/754–759, 324/761–762, 765; 439/66, 80–81, 482

(56) References Cited

U.S. PATENT DOCUMENTS

| | | | |
|---|---|---|---|
| 5,613,861 A | 3/1997 | Smith et al. | |
| 5,832,601 A | 11/1998 | Eldridge et al. | |
| 6,014,032 A * | 1/2000 | Maddix et al. | 324/762 |
| 6,027,630 A | 2/2000 | Cohen | |
| 6,218,203 B1 * | 4/2001 | Khoury et al. | 438/15 |
| 6,414,501 B2 * | 7/2002 | Kim et al. | 324/754 |
| 6,482,013 B2 * | 11/2002 | Eldridge et al. | 439/66 |

* cited by examiner

Primary Examiner—Minh N. Tang
(74) Attorney, Agent, or Firm—Squire, Sanders & Dempsey L.L.P.; Aaron Wininger

(57) ABSTRACT

A probe has a cantilever arm coupled to a base via an anchor. A surface of the arm facing the base or a surface of the base facing the arm has steps with contact points that contact the base when the arm is depressed. Alternatively, the surface of the arm and/or the surface of the base may be curved.

8 Claims, 7 Drawing Sheets

HIGHLY RESILIENT CANTILEVER SPRING PROBE FOR TESTING ICS

FIELD OF THE INVENTION

This invention relates in general to devices for testing electronic circuitry and in particular, but not exclusively, to a device for probing integrated circuits formed on a semiconducting wafer.

DESCRIPTION OF RELATED ART

Because many ICs (integrated circuits) formed on a semiconducting wafer may not be functional, it is desirable to test them before packaging or including them in a MCM (multi-chip module). The device which carries the electrical power and signals from a tester to the IC is known as a probe card. Traditional probe cards carry the electrical signals to the bond pads of the IC via tapered needles which are affixed in a cantilever manner to a PCB (printed circuit board). These needle probes, hereafter referred to as probes, are typically made by electro-chemically etching a wire of tungsten, copper, palladium, or alloys thereof. During probing, the probes make physical contact with the IC bond pads, scratching them in the process. Scratching is important in order for the probes to make good electrical contact with the bond pads which are usually covered with a native and insulating, oxide film.

The total number of probes on a probe card has increased steadily as ICs have become more complex and multi-die testing has become the norm. Likewise, bond pad size and their pitch have also decreased to accommodate the relatively smaller ICs. The aforementioned cantilever style probe cards do not scale well to the current trends primarily because they are manually intensive to build. Other horizontal probes have been developed by borrowing heavily from semiconductor manufacturing. Eldridge, et. al. describes in U.S. Pat. No. 5,832,601 a method by which a wire bonder makes the skeleton of the probe. Smith, et. al. describes a method of making a thin-film spring by sputtering in U.S. Pat. No. 5,613,861. Cohen describes a method by which 3-dimensional structures may be fabricated by the deposition and selective removal of sacrificial metal layers in U.S. Pat. No. 6,027,630.

No known device, however, attempts to distribute the applied bending stress uniformly along the length of the probe for the purpose of generating more resiliency in a volume-limited space such as occurs in wafer-level testing.

SUMMARY OF THE INVENTION

The present invention is directed to a resilient spring probe whose deflection is controlled in such a manner that the maximum bending stress along the length of the spring when fully deflected is at or close to the yield strength of the spring material.

In an embodiment of the invention, the probe comprises a cantilever spring arm; a base, coupled to the arm via an anchor at a first end of the arm; and a tip, disposed on a second end of the arm. A surface of the arm facing the base has a stepped surface. In another embodiment of the invention, a surface of the base facing the arm has a stepped surface. In another embodiment of the invention, the surface of the arm facing the base and/or the surface of the base facing the arm is curved.

In an embodiment of the invention, a method comprises aligning a wafer die bond pad with a probe tip of the probe; driving the wafer into the probe tip; and electrically testing the wafer.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
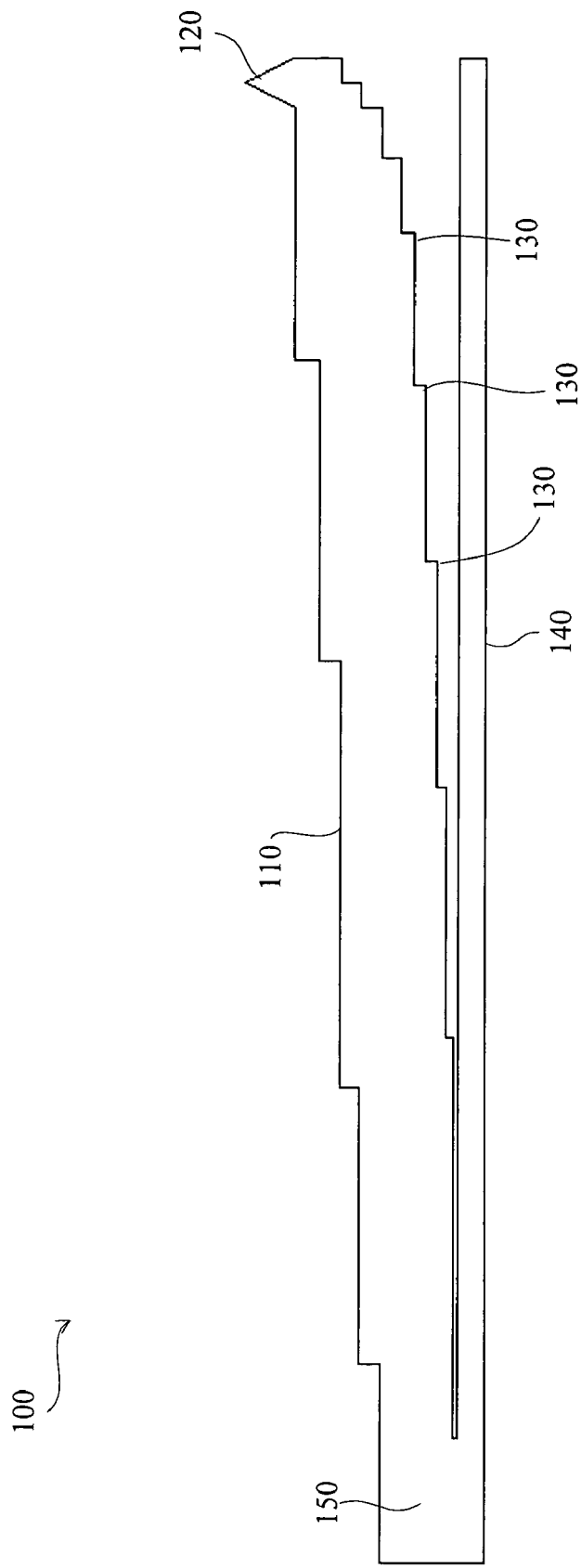
FIG. 1 is a diagram illustrating a probe according to an embodiment of the present invention.
Figure 2:
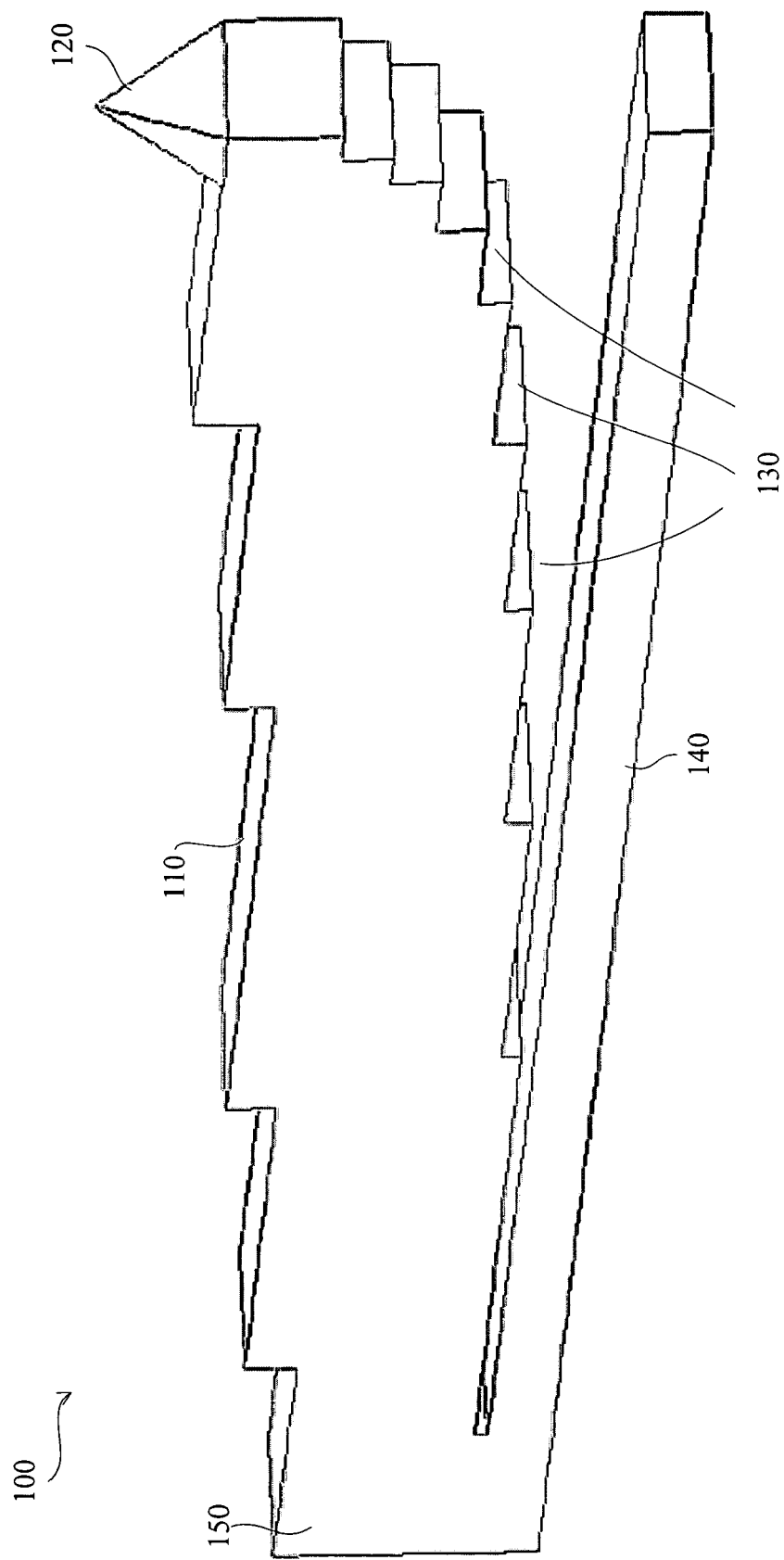
FIG. 2 is a diagram illustrating a perspective view of the probe FIG. 1.

FIGS. 1 and 2 are diagrams illustrating an embodiment of the invention. Specifically, a cantilever spring-based probe 100 comprised of multiple layers manufactured using electroplating technology discussed in U.S. Pat. No. 6,027,630 is illustrated. The probe 100 comprises an arm 110 coupled to a base 140 via an anchor 150 at one end of the arm 110. A tip 120 is disposed at the other end of the arm 110. The tip 120 is made of a hard precious metal such as rhodium while the arm 110 is made from a strong conductive metal such as electrodeposited Ni. However, this does not preclude the use of other material combinations. The arm 110 further includes a plurality of step like structures on both a top and bottom surface. The steps on the bottom surface include contact points 130 (e.g., 9) that contact the base 140 when the probe 100 is engaged. In one embodiment, spacing between the contact points 130 decreases with distance from the anchor 150.

Figure 3:
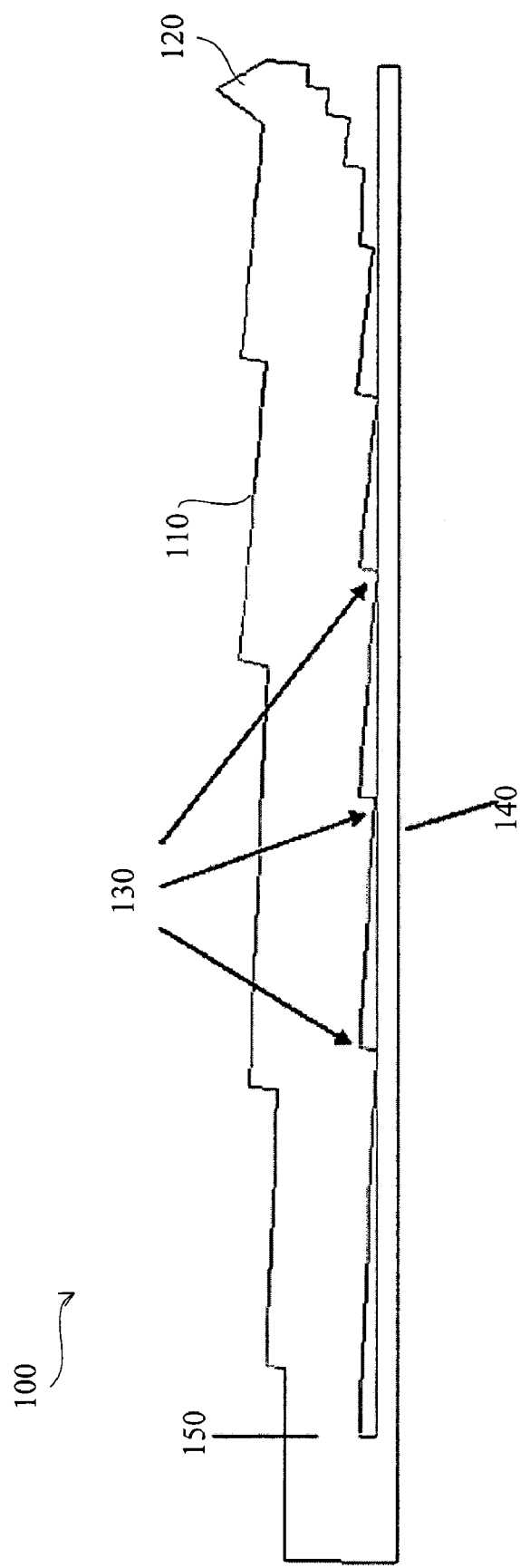
FIG. 3 is a diagram illustrating a spring of FIG. 1 in a deflected condition.
Figure 4:
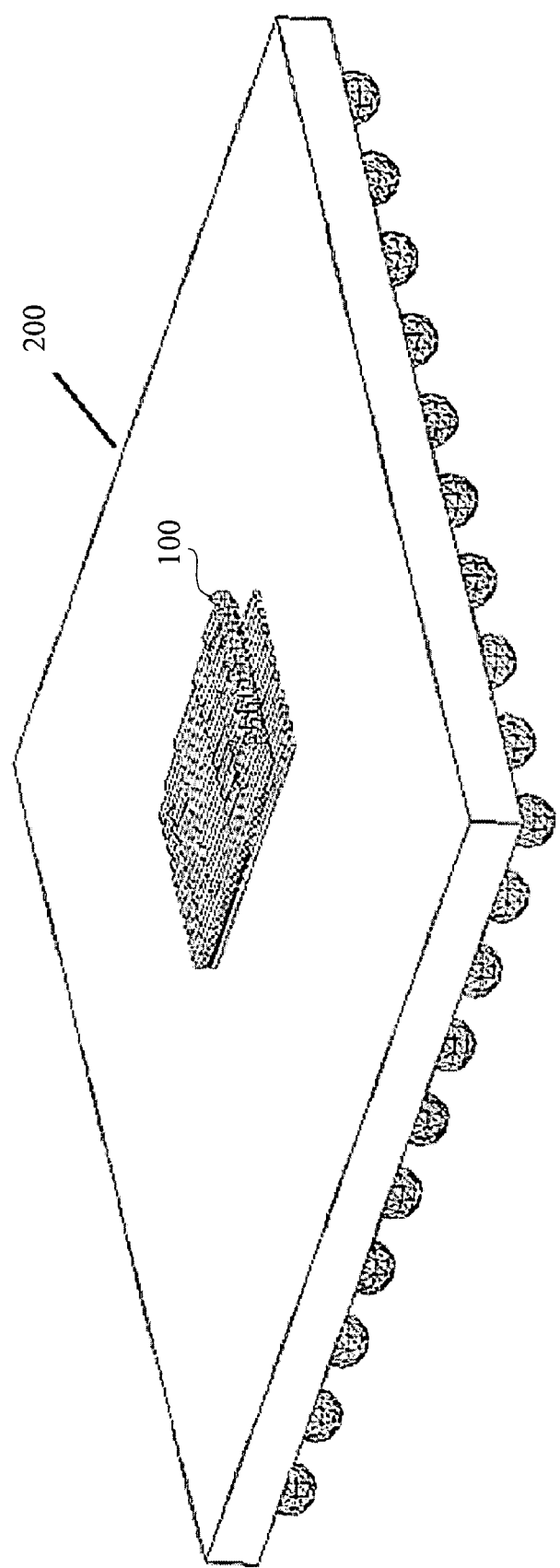
FIG. 4 is a diagram illustrating a plurality of resilient springs bonded to a space transformer.

In accordance with an embodiment of the invention the arm 110 distributes the bending stress through the length of the probe 100 by controlling the deflection curve. As shown in FIG. 3, one or more contact points 130 make contact with the base 140 as the arm 110 deflects, thus preventing an overstress in the arm adjacent to the structural anchor 150 while at the same time causing the arm's 110 elastic energy to be stored further along the length of the arm 110. A plurality of such probes 100 are shown bonded to a space transformer 200 in FIG. 4. The space transformer 200 is in turn bonded to a PCB to comprise the probe card.

Fully-stressed beams are known in the art. Textbooks on mechanics discuss the parabolic-shaped cantilever beam as that which gives a uniformly distributed maximum normal stress (i.e., ignoring shear stress). However, fully-stressed beams are normally associated with attempts to reduce weight, save material, and/or decrease moment of inertia. None of these are a consideration for the probe 100.

Embodiments of the present invention are different from traditional fully-stressed beams in three ways. First, it is not fully-stressed, only nearly so, because the arm 2 is comprised of flat layers and a finite number of contact points 130. Therefore, the bending stress will not be perfectly uniform even though it is designed with uniformity in mind. Second, traditional fully-stressed beams vary their section modulus for the above reasons, removing material where it's not needed. In the present invention the maximum stress uniformity is primarily achieved by controlling the deflection curve and less so by varying the section modulus. This translates into better resiliency and current carrying capacity because little material is removed from the arm 110 just under the tip 120. The material is available to store elastic energy and withstand electric current that might otherwise overheat a thinned structure. Third, the present invention approximates the fully-stressed condition only at maximum overdrive. In the early stage of deflection the stress is concentrated at the structural anchor 150. In a traditional fully-stressed beam the stress is uniformly distributed even at low stress.

The probe 100 dimensions can be varied to accommodate the required spring rate and maximum allowable deflection. However, there isn't necessarily a unique probe dimension to satisfy one particular spring rate. Initial considerations determined by the physical probing requirements might include allowable probe length, height, and width. Once these are decided, layer thicknesses and lengths can be optimized for the desired force or deflection using commercially available finite element analysis software. A typical probe would have an overall length of about 500–1000 microns, width of about 10–30 microns, and an interlayer height of about 2–20 microns. The tip height would be about 10–30 microns tall. These ranges are not meant to be exhaustive but merely show that such a probe is well within current manufacturing capabilities.

A further benefit of the contact points 130 is the reduced electrical path that a signal must traverse from the tip 120. Instead of having to travel the full length of the arm 110 the signal would only have to short directly into the base 140 via the contact points 130. Besides improving the high-speed performance by reducing the length of uncontrolled impedance, the contact points 130 would also provide an alternate parallel electrical path for higher current probes such as power and ground probes. Joule heating would be reduced in the highly stressed areas thereby improving the probe's creep resistance.

Figure 5:
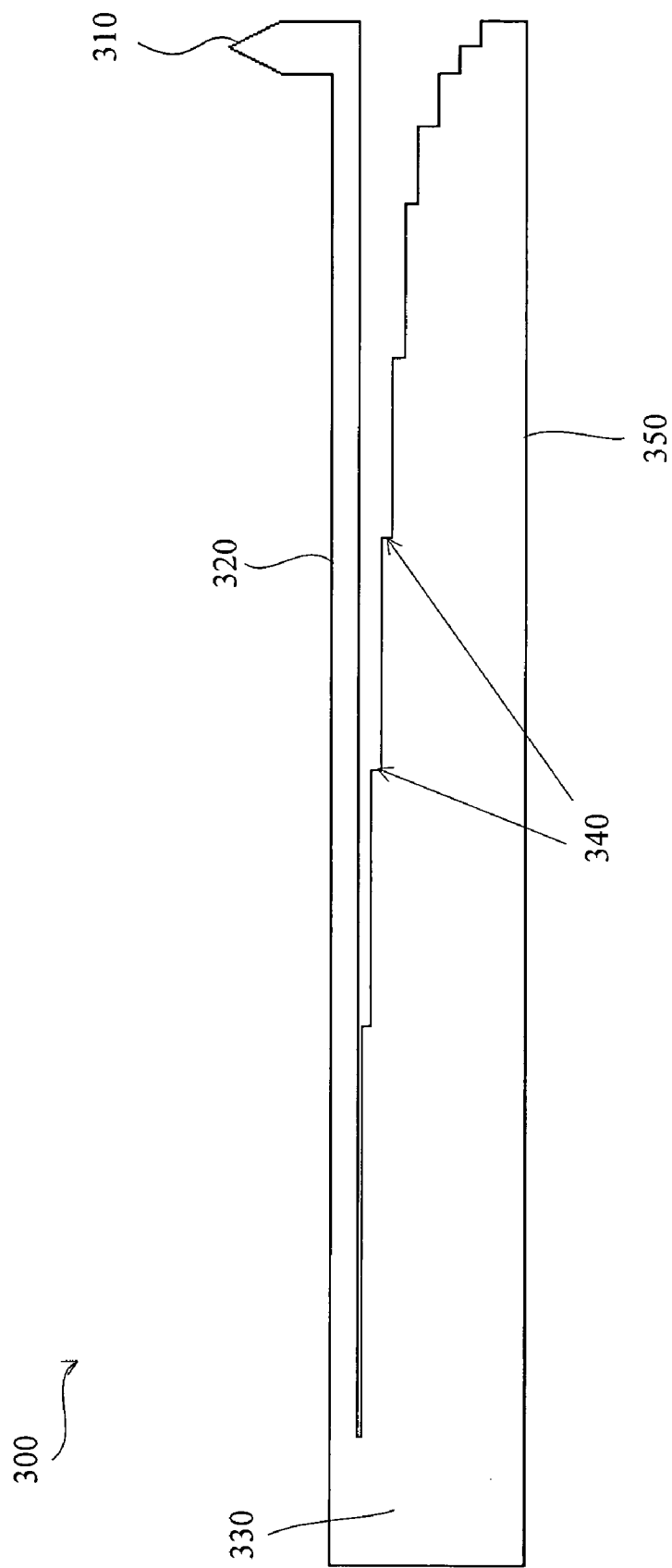
FIG. 5 is a diagram illustrating a probe according to another embodiment of the invention.

Another embodiment of the invention also consisting of multiple layers manufactured using technology discussed in U.S. Pat. No. 6,027,630 is shown in FIG. 5. In this embodiment a probe 300 comprises a base 350 with a plurality of steps. The base 350 is coupled to an arm 320 via an anchor 330 at one end of the arm 320. A tip 310 is disposed at the other end of the arm 320. The base 350 features a plurality of contact points 340 along the steps of the base 350. The steps decrease in length as distance from the anchor 330 increases. In an embodiment of the invention, the arm 320 has a length and width equal to the length and width of the base 350. In an embodiment of the invention, the base 350 includes 8 steps.

The arm 320 is of constant section modulus and the base 350 is stepped in order to control the deflection curve. As the probe 300 deflects, the contact points 340 progressively make contact with the arm 320 thus preventing an overstress in the arm adjacent to the structural anchor 330 while at the same time causing the spring's elastic energy to be stored further along the length of the arm 320. In an embodiment the probe tip 310 is made taller than the tip 120 by about 30–50 microns so as to prevent the fixed end of arm 320 from crashing into the wafer during overdrive. A taller tip produces a longer scrub in general. The tip end 310 of the arm 320 rotates during overdrive, causing a taller tip to sweep out a longer arc. However, a longer scrub is not always desirable as it may overly damage the bond pad and cause wire bond reliability problems. In light of the above, it may be preferable to use the probe 100, wherein the tip 110 height is minimized and the arm 110 is stepped on the wafer side so as to prevent contact with the wafer.

In yet another embodiment of the invention, a multiple layer probe as previously described but with discrete contact points located on both the arm 110 as in FIG. 1 and the base 350 as in FIG. 5.

It is within the scope of this invention that the discrete contact points either on the arm 110 or on the base 350 need not be the corners of steps but could be the surfaces of small protrusions.

Figure 6:
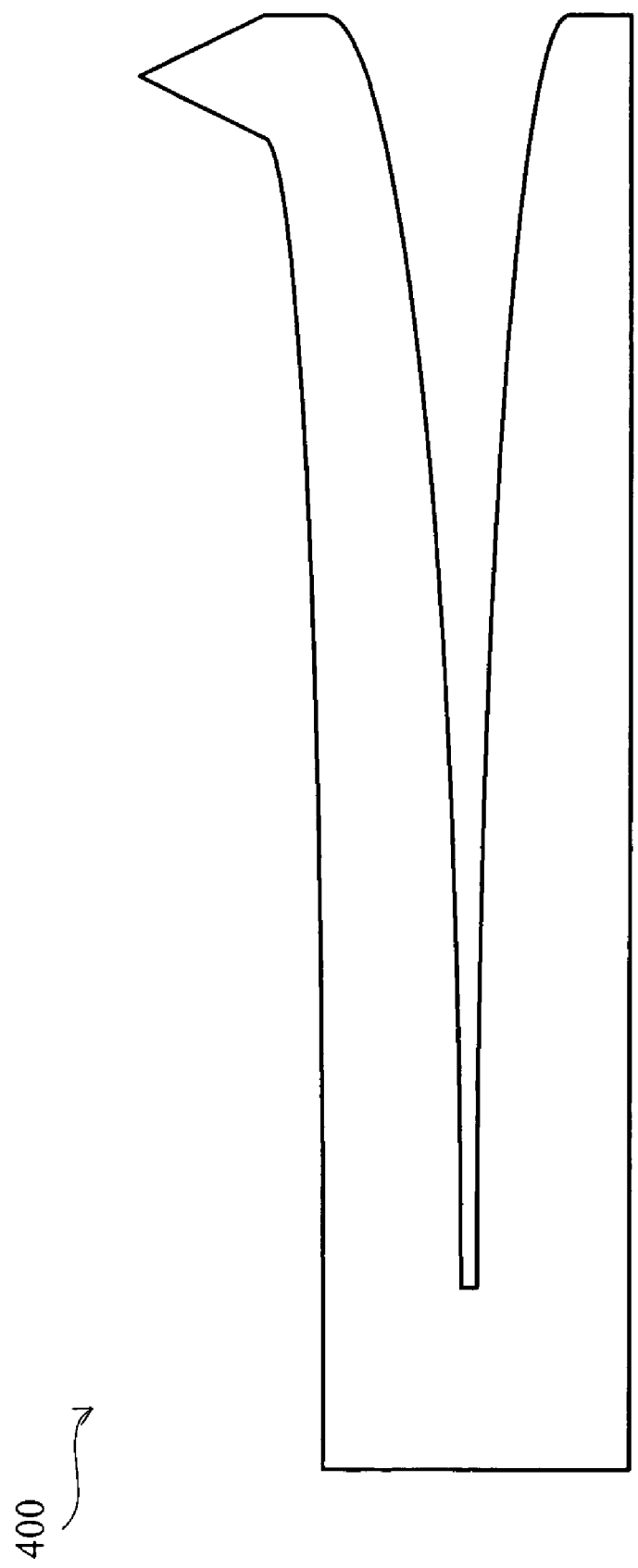
FIG. 6 is a diagram illustrating a probe with a conforming base/arm pair.

A probe with discrete contact points along its length could be manufactured laterally (in the width direction) in just one layer rather than vertically in multiple layers. A high aspect ratio lithography process such as LIGA would be suitable for this purpose. In fact, with a laterally-built probe the control of the deflection curve need not be with discrete points but rather with a continuous base/arm conforming pair. An embodiment is illustrated in FIG. 6. Upon deflection the arm conforms to the shape of the base in a continuous manner. As with the discretely contacting probe, there is no unique base/arm shape for a desired spring rate, and finite element analysis software can aid in a design that distributes the bending stress along the length of the arm. While not preferred due to the difficulty in handling and assembling individual probes into a larger array, such laterally-built probes, manufactured in one or more layers, are within the scope of the invention.

It is also within the scope of this invention that the spring probe has a residual stress so as to further improve the resiliency. The residual stress may be induced by initially overdriving the probe beyond its as-deposited yield strength so that upon elastic relaxation both compressive and tensile residual stresses exist within the body of the probe. Overstressing the spring serves two functions. First, it strain hardens the as-deposited material in the outermost sections of the beam (i.e. that part of the beam farthest from the neutral axis) thereby increasing the yield strength in that part of the beam. Second, it imparts a residual stress field that improves the resiliency by redistributing the elastic strain energy during bending from the outer sections of the beam to the interior sections. The discrete contact points must be adjusted in order to provide a uniform bending stress along the length of the beam that exceeds the as-deposited yield strength of the material. The spring probe will be deformed from its as-deposited shape, but resiliency for future overdrives will be improved due to the strain hardening effect and residual stress field.

The manufacturing process is a layer by layer process so the arm and base will be parallel to each other in the as-deposited condition. When the arm is overdriven so as to create a residual stress, the arm is at an angle to the base. The angle that the arm makes with the base changes gradually along the length of the probe until it reaches a maximum at the tip. The angle the tip rotates from vertical due to the preloading can vary from about 5 to about 15 degrees.

Figure 7:
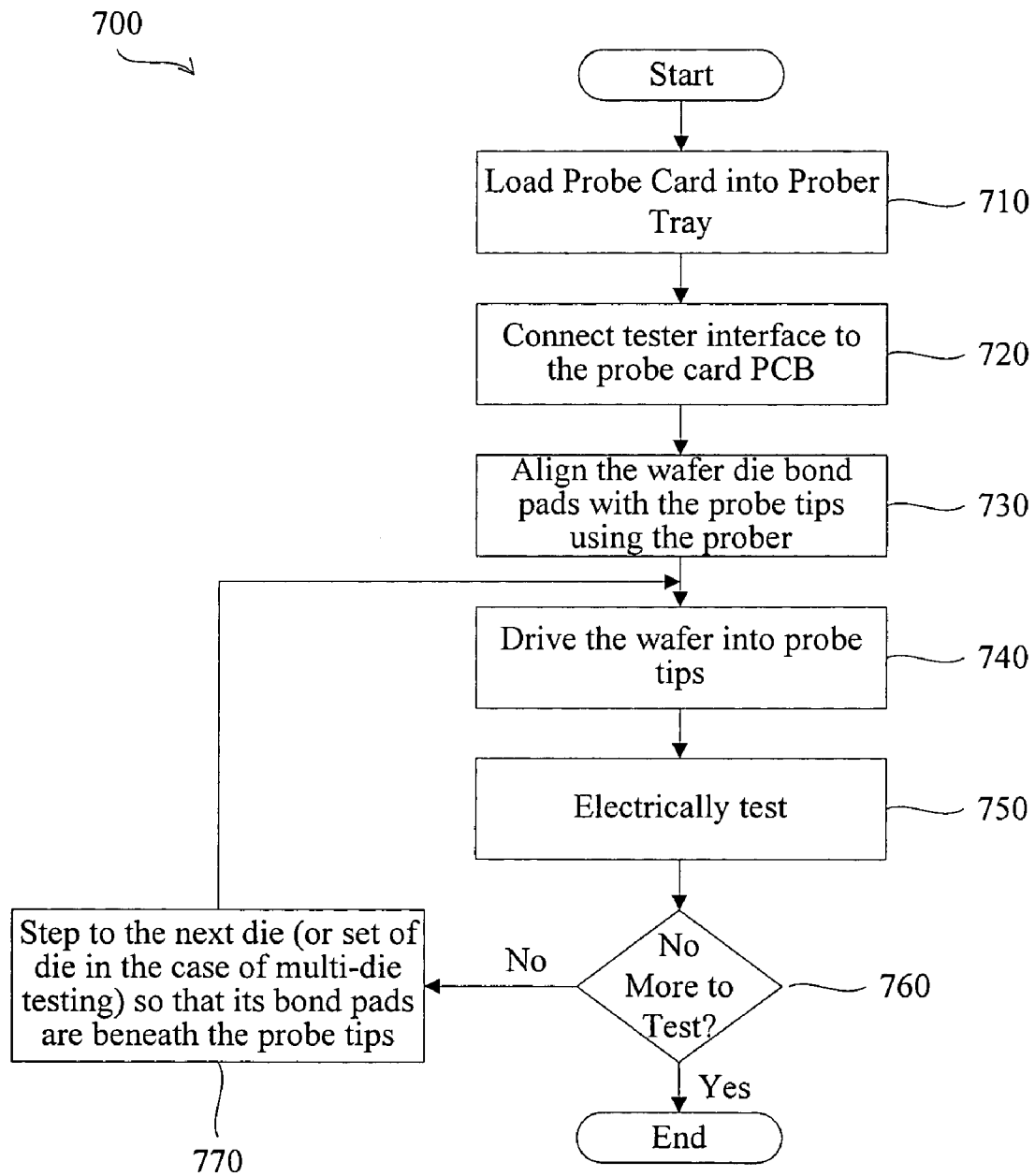
FIG. 7 is a flowchart illustrating a method of using a probe according to an embodiment of the present invention.

FIG. 7 is a flowchart illustrating a method 700 of using a probe according to an embodiment of the present invention. First, a probe card having at least one probe (e.g., probes 100 and/or 300) is loaded (710) into a prober tray of a probing device. Next, a tester interface is connected (720) to a probe card PCB. Wafer die bond pads are then aligned (730) with the probe tips of the probes using a prober. The wafer is then driven (740) into the probe tips and electrically tested (750). After testing, if (760) there are no more dies to test, then the method 700 ends. Otherwise, the method 700 further comprises stepping (770) to the next die so that its bond pads are beneath the probe tips and the driving (740) and testing (750) are repeated until all die on the wafer are tested. The method 700 then ends.

While particular embodiments of the present invention have been shown and described, it will be obvious to those skilled in the art that changes and modifications can be made without departing from this invention in its broader aspects. Therefore, the appended claims are to encompass within their scope all such changes and modifications as fall within the true spirit and scope of this invention.

What is claimed is:

1. A probe, comprising:
   a cantilever spring arm;
   a base, coupled to the arm via an anchor at a first end of the arm; and
   a tip, disposed on a second end of the arm;
   wherein
      a surface of the arm facing the base has a stepped surface,
      the surface has a plurality of contact points, and
      spacing between the contact points decreases with distance from the anchor.

2. The probe of claim 1, wherein a surface of the arm facing a wafer has a stepped surface.

3. The probe of claim 1, wherein the length of the steps of the stepped surface decrease with distance from the anchor.

4. The probe of claim 1, wherein at least one of the contact points contacts the base during IC testing to prevent overstress in the arm adjacent to the anchor while causing elastic energy to be stored further along the length of the arm.

5. The probe of claim 1, wherein the arm comprises a plurality of layers formed using electroplating.

6. The probe of claim 1, wherein the cantilever spring arm is overstressed before testing.

7. A probe card, comprising:
   a space transformer;
   a plurality of probes coupled to a surface of the space transformer; and
   a printed circuit board communicatively coupled to the space transformer;
   wherein the probes each comprise
      a cantilever spring arm;
      a base, coupled to the arm via an anchor at a first end of the arm; and
      a tip, disposed on a second end of the arm;
      wherein
         a surface of the arm facing the base has a stepped surface,
         the surface has a plurality of contact points, and
         spacing between the contact points decreases with distance from the anchor.

8. A method, comprising:
   aligning a wafer die bond pad of a wafer with a probe tip of the probe of claim 1;
   driving the wafer into the probe tip; and
   electrically testing the wafer.

* * * * *